(12) United States Patent
Casebolt et al.

(10) Patent No.: US 9,400,526 B2
(45) Date of Patent: Jul. 26, 2016

(54) BUMPER FOR A COMPUTING DEVICE AND RELATED ASSEMBLY AND METHOD

(71) Applicant: Apple Inc., Cupertino, CA (US)

(72) Inventors: Matthew P. Casebolt, Fremont, CA (US); Derrick Tek-Kien Jue, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 326 days.

(21) Appl. No.: 14/022,120

(22) Filed: Sep. 9, 2013

(65) Prior Publication Data

US 2015/0070838 A1    Mar. 12, 2015

(51) Int. Cl.
*H05K 5/02*       (2006.01)
*G06F 1/16*       (2006.01)
*B05D 1/36*       (2006.01)
*B05D 3/12*       (2006.01)

(52) U.S. Cl.
CPC ............ *G06F 1/1656* (2013.01); *H05K 5/0234* (2013.01); *B05D 1/36* (2013.01); *B05D 3/12* (2013.01); *G06F 1/1633* (2013.01); *H05K 5/0204* (2013.01)

(58) Field of Classification Search
CPC .......... G06F 2200/1633; G06F 1/1626; G06F 1/1656; G06F 1/16; G06F 1/1628; G06F 1/1633; G06F 1/1635; G06F 1/18; G06F 1/203; H05K 7/023; H05K 5/02; H05K 5/0234; H05K 5/0204; B05D 1/36; B05D 3/12

USPC ................ 361/679.55–679.59; 248/687; 427/407.1, 356

See application file for complete search history.

(56) References Cited

U.S. PATENT DOCUMENTS

| 6,409,874 B1 | 6/2002 | Van Der Aar et al. | |
| 6,416,869 B1 | 7/2002 | van Ooij et al. | |
| 2013/0235521 A1* | 9/2013 | Burch | G06F 1/1635 361/679.48 |
| 2014/0120325 A1* | 5/2014 | Brewington | B32B 13/00 428/192 |
| 2015/0036289 A1* | 2/2015 | Aurongzeb | G06F 1/1679 361/679.55 |

OTHER PUBLICATIONS

Silicone Technologies Catalog. silicontechnologies.com. Retrieved Aug. 21, 2013, from http://www.siliconetechnologies.com/siliconetechnologiescatalog.pdf.

\* cited by examiner

*Primary Examiner* — Anthony Haughton
*Assistant Examiner* — Ingrid Wright
(74) *Attorney, Agent, or Firm* — Downey Brand LLP

(57) ABSTRACT

Bumpers for electronic devices are provided. The bumpers may be formed from a polymer coupled to a housing via a primer. The primer may include a first functional group configured to form a chemical bond with the housing a second functional group configured to form a bond with the polymer. Accordingly, externally-mounted bumpers that do not impinge upon internal space within a housing may be provided. However, the bumpers may be employed for various other purposes. Related portable electronic devices, assemblies, and methods are also provided.

20 Claims, 17 Drawing Sheets

BUMPER FOR A COMPUTING DEVICE AND RELATED ASSEMBLY AND METHOD

TECHNICAL FIELD

The present disclosure relates generally to bumpers, and more particularly to bumpers for a computing device and related assembly and method.

BACKGROUND

Bumpers are employed on computing devices for a variety of purposes. For example, feet on the bottom of a laptop computer may elevate a housing thereof to improve cooling of the laptop. The bumpers may additionally resist slippage such that the laptop may remain securely in place on angled surfaces. Further, the bumpers may be formed from an elastomeric material that is configured to avoid scratching or damaging a surface on which the laptop is placed. Additionally, use of elastomeric material may provide some degree of shock adsorption. Accordingly, feet on laptop computers and various other embodiments of bumpers may serve a variety of purposes.

However, existing embodiments of bumpers have certain disadvantages. For example, bumpers may occupy space in a computing device that may be more preferably employed for other purposes. In this regard, in the continuing pursuit to improve computing devices, manufacturers have attempted to produce computing devices having smaller dimensions. In this pursuit, the space allocated for each of the various components therein has been reduced in order to minimize the overall size of the computing device.

Accordingly, improved bumpers for computing devices and related assemblies and methods may be desirable.

SUMMARY

In one aspect an assembly is provided. The assembly may include a housing defining an outer surface and a protrusion extending outwardly from the outer surface. A primer may be applied to the outer surface of the housing at least at the protrusion. Further, a bumper may be coupled to the outer surface of the housing at least at the protrusion via the primer. The primer may comprise a first functional group configured to bond to the housing and a second functional group configured to bond to the bumper.

In some embodiments the primer may be a silane composition, the bumper may be formed from a silicone composition, and the housing may be formed from an aluminum alloy. The bumper may not extend through the housing. In this regard, the housing may be imperforate at the protrusion. The bumper may define a thickness that is substantially uniform. The thickness may be from about 0.1 micrometers to about 0.5 micrometers. Further, the thickness of the bumper may be less than a thickness of the protrusion.

In an additional aspect a computing device is provided. The portable computing device may include a housing defining an outer surface. Electronic components may be received in the housing. Further, the portable computing device may include a primer applied to the outer surface of the housing and a bumper coupled to the outer surface of the housing via the primer. The primer may include a first functional group configured to bond to the housing and a second functional group configured to bond to the bumper.

In some embodiments the electronic components may include a battery received in the housing, wherein the housing is positioned between the battery and the bumper. The bumper may not extend through the housing, and the housing may be imperforate at the bumper. In one embodiment the bumper may comprise a foot positioned at a bottom of the housing. In another embodiment the bumper may extend around the perimeter of the housing. The housing may define a protrusion extending outwardly from the outer surface, and the bumper may be positioned at the protrusion.

In an additional aspect a method for forming a bumper is provided. The method may include providing a housing defining an outer surface, applying a primer to the outer surface of the housing, and applying a polymer to the outer surface of the housing at the primer. The primer may include a first functional group configured to bond to the housing and a second functional group configured to bond to the polymer.

In some embodiments applying the primer to the outer surface of the housing may include flood coating the primer on at least a portion of the outer surface. Further, applying the polymer to the outer surface of the housing may include printing the polymer on the outer surface.

In another embodiment applying the primer to the outer surface of the housing may include printing the primer on the outer surface. Further, applying the polymer to the outer surface of the housing may include flood coating the polymer on at least a portion of the outer surface. The method may also include cutting the polymer around the primer.

In some embodiments applying the polymer to the outer surface of the housing at the primer may include applying the polymer at a protrusion extending outwardly from the outer surface of the housing. Further, applying the polymer to the outer surface of the housing at the primer may include applying the polymer in a thickness that is substantially uniform. The thickness of the polymer may be from about 0.1 micrometers to about 0.5 micrometers in some embodiments.

Accordingly, the methods, apparatuses, assemblies, and portable computing devices provided herein may include bumpers formed from material coupled to a housing via a primer. This configuration may allow for a secure bond that does not require use of an aperture extending through the housing. Accordingly, liquid ingress may be resisted, and usage of internal space within the housing may be avoided.

Other apparatuses, methods, features and advantages of the disclosure will be or will become apparent to one with skill in the art upon examination of the following figures and detailed description. It is intended that all such additional systems, methods, features and advantages be included within this description, be within the scope of the disclosure, and be protected by the accompanying claims.

BRIEF DESCRIPTION OF THE DRAWINGS

The included drawings are for illustrative purposes and serve only to provide examples of possible structures and arrangements for the disclosed apparatuses, assemblies, methods, and systems. These drawings in no way limit any changes in form and detail that may be made to the disclosure by one skilled in the art without departing from the spirit and scope of the disclosure.

DETAILED DESCRIPTION

Figure 1:
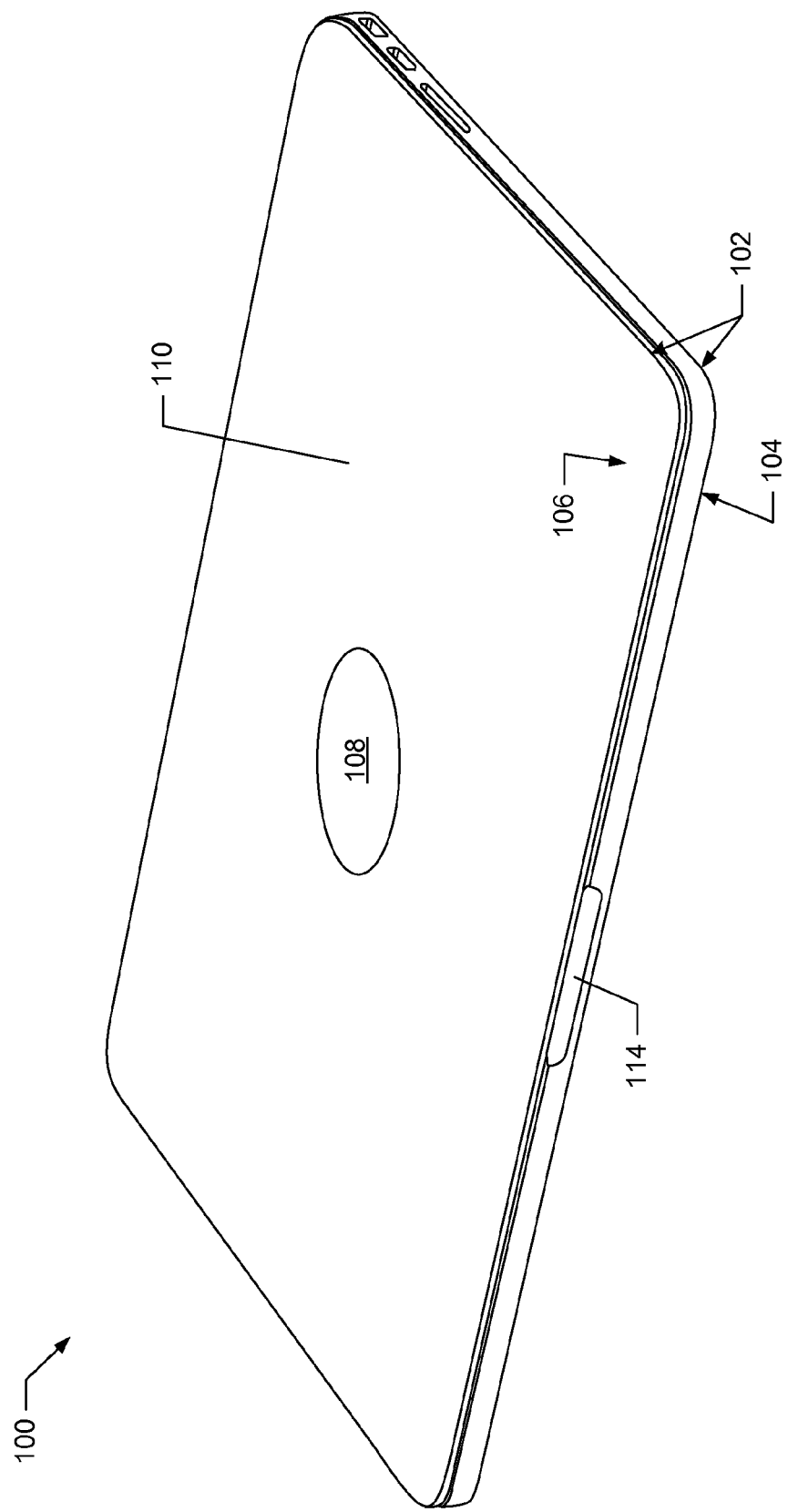
FIG. 1 illustrates a front facing perspective view of an embodiment of the portable computing device in a closed configuration according to an example embodiment of the present disclosure.

Representative applications of apparatuses and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

As described in detail below, the following relates to bumpers. The bumpers may be employed in a variety of devices including, for example, electronic devices. By way of more specific example, the bumpers may be employed in a computing device such as a desktop computer, a laptop computer, net book computer, tablet computer, cellphone, smartphone, etc., or any accessory therefor such as a keyboard and a monitor. Thus, purely for purposes of example, embodiments of a portable computing device and a smartphone employing bumpers are described and illustrated herein. However it should be understood that various other embodiments of devices may employ the bumpers.

In one embodiment a portable computing device can include a multi-part housing having a top case and a bottom case joining at a reveal to form a base portion. The portable computing device can have an upper portion (or lid) that can house a display screen and other related components whereas the base portion can house various processors, drives, ports, battery, keyboard, touchpad and the like. The top case and the bottom case can each be joined in a particular manner at an interface region such that the gap and offset between top and bottom cases are not only reduced, but are also more consistent from device to device during the mass production of devices.

In a particular embodiment, the lid and base portion can be pivotally connected with each other by way of what can be referred to as a clutch assembly. The clutch assembly can include at least a cylindrical portion that in turn includes an annular outer region, and a central bore region surrounded by the annular outer region, the central bore suitably arranged to provide support for electrical conductors between the base portion and electrical components in the lid. The clutch assembly can also include a plurality of fastening regions that couple the clutch to the base portion and the lid of the portable computing device with at least one of the fastening regions being integrally formed with the cylindrical portion such that space, size and part count are minimized.

The top case can include a cavity, or lumen, into which a plurality of operational components can be inserted during an assembly operation. In the described embodiment, the operational components can be inserted into the lumen and attached to the top case in an "top-bottom" assembly operation in which top most components are inserted first followed by components in a top down arrangement. For example, the top case can be provided and shaped to accommodate a keyboard module. The keyboard module can include a keyboard assembly formed of a plurality of keycap assemblies and associated circuitry, such as a flexible membrane on which can be incorporated a switching matrix and protective feature plate. Therefore, following the top-bottom assembly approach, the keyboard assembly is first inserted into the top case followed by the flexible membrane and then the feature plate that is attached to the top case. Other internal components can then be inserted in a top to bottom manner (when viewed from the perspective of the finished product).

In one embodiment, the keyboard module can be configured in such a way that a keycap assembly can be used to replace a power switch. For example, in a conventional keyboard each of a top row of keycaps can be assigned at least one function. However, by re-deploying one of the keycaps as a power button, the number of operational components can be reduced by at least eliminating the switch mechanism associated with the conventional power button and replacing it with the already available keycap assembly and associated circuitry.

In addition to the keyboard, the portable computing device can include a touch sensitive device along the lines of a touch pad, touch screen, etc. In those embodiments where the portable computing device includes a touch pad the touch pad can be formed from a glass material. The glass material provides a cosmetic surface and is the primary source of structural rigidity for the touchpad. The use of the glass material in this way significantly reduces the overall thickness of the touchpad compared to previous designs. The touchpad can include circuitry for processing signals from a sensor associated with the touchpad. In one embodiment, the circuitry can be embodied as a printed circuit board (PCB). The PCB can be formed of material and placed in such a way that it provides structural support for the touchpad. Thus, a separate touchpad support is eliminated.

In one embodiment, the top case can be formed from a single billet of aluminum that is machined into a desired shape and size. The top case can include an integrated support system that adds to the structural integrity of the top case. The integrated support system can be continuous in nature in that there are no gaps or breaks. The integrated support system can be used to provide support for individual components (such as a keyboard). For example, the integrated support system can take the form of ribs that can be used as a reference datum for a keyboard. The ribs can also provide additional structural support due to the added thickness of the ribs. The ribs can also be used as part of a shield that help to prevent light leaking from the keyboard as well as act as a Faraday cage that prevents leakage of extraneous electromagnetic radiation.

The continuous nature of the integrated support system can result in a more even distribution of an external load applied to the multi-part housing resulting in a reduced likelihood of warping, or bowing that reduces risk to internal components. The integrated support system can also provide mounting structures for those internal components mounted to the multi-part housing. Such internal components include a mass storage device (that can take the form of a hard disk drive, HDD, or solid state drive, SSD), audio components (audio jack, microphone, speakers, etc.) as well as input/output devices such as a keyboard and touch pad.

These and other embodiments are discussed below with reference to FIGS. 1-17. However, those skilled in the art will readily appreciate that the detailed description given herein with respect to these figures is for explanatory purposes only.

FIG. 1 illustrates a portable computing device 100 in the form of a laptop computer in accordance with an example embodiment of the present disclosure. More particularly, FIG. 1 shows a front facing perspective view of the portable computing device 100 in a closed configuration. As illustrated, the portable computing device 100 may include a housing 102 comprising a base portion 104 and a lid portion 106. In the closed configuration, the lid portion 106 and base portion 104 form what appears to be a uniform structure having a continuously varying and coherent shape that enhances both the look and feel of the portable computing device 100. In some embodiments portable computing device 100 may include a logo 108 at a rear case 110 of the lid portion 106 of the housing 102. In one embodiment, the logo 108 can be illuminated by light emitted from a display 112 (see, e.g., FIG. 2).

The base portion 104 can be pivotally connected to the lid portion 106 by way of a hinge that may include a clutch assembly in some embodiments. The base portion 104 may include an inset portion 114 suitable for assisting a user in lifting the lid portion 106 by, for example, a finger. Accordingly, the lid portion 106 of the housing 102 can be moved with respect to the base portion 102 of the housing with the aid of the clutch assembly from a closed position (see, e.g., FIG. 1) to an open position (see, e.g., FIG. 2).

Figure 2:
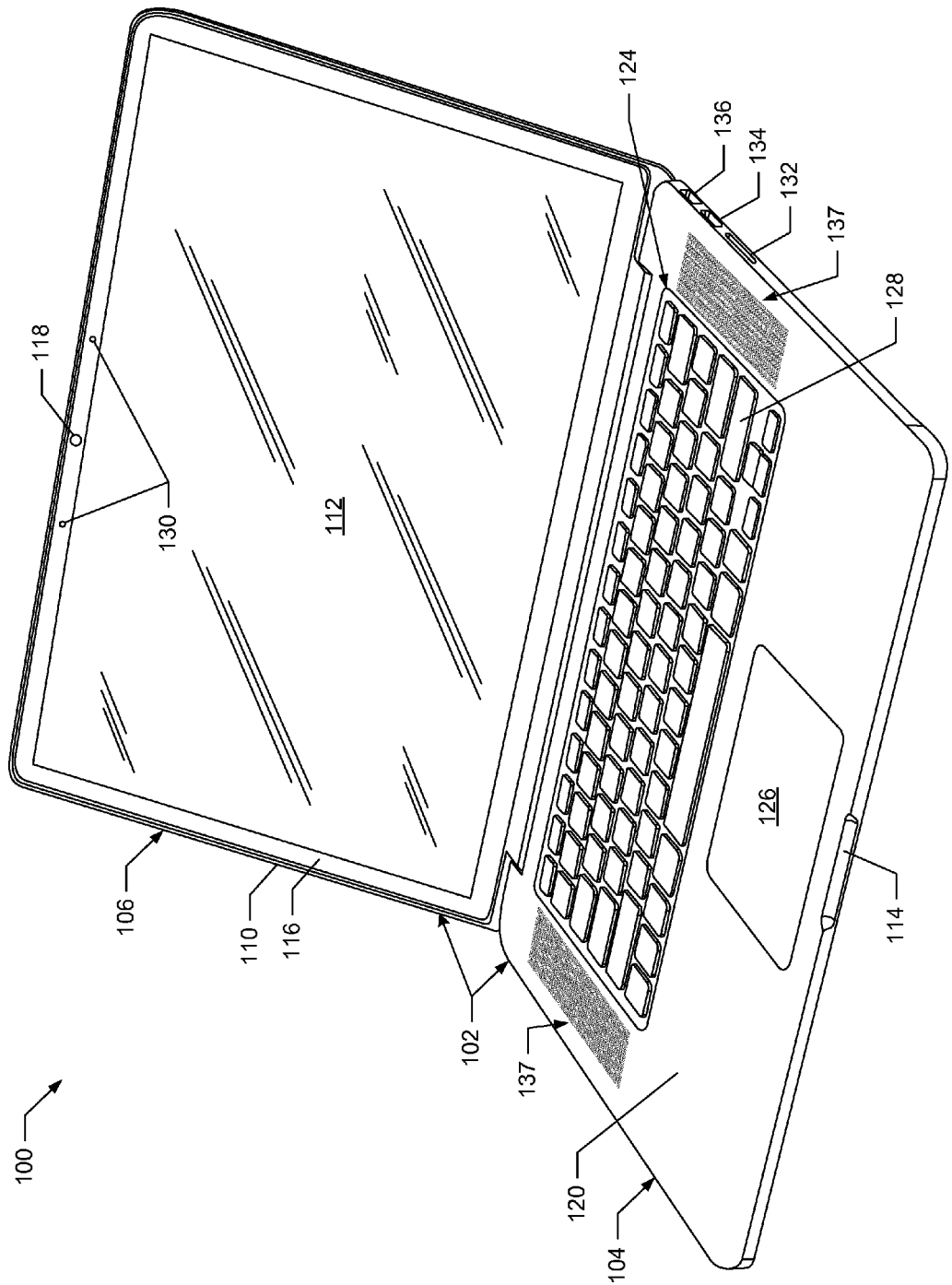
FIG. 2 illustrates the portable computing device of FIG. 1 in an open configuration according to an example embodiment of the present disclosure.

FIG. 2 shows a front facing perspective view of the portable computing device 100 in the open configuration. The display 112 may be coupled to the rear case 110 of the lid portion 106 such that the display is provided with structural support. In this regard, the lid portion 106 can be formed to have unibody construction provided by the rear case 110 that can provide additional strength and resiliency to the lid portion which is particularly important due to the stresses caused by repeated opening and closing. In addition to the increase in strength and resiliency, the uni-body construction of the lid portion 106 can reduce overall part count by eliminating separate support features, which may decrease manufacturing cost and/or complexity.

The lid portion 106 may include a mask (also referred to as display trim) 116 that surrounds the display 112. The display trim 116 can be formed of an opaque material such as ink deposited on top of or within a protective layer of the display 112. Thus, the display trim 116 can enhance the overall appearance of display 112 by hiding operational and structural components as well as focusing attention onto the active area of the display.

The display 112 can display visual content such as a graphical user interface, still images such as photos as well as video media items such as movies. The display 112 can display images using any appropriate technology such as a liquid crystal display (LCD), a light emitting diode (LED) display, an organic light emitting diode (OLED) display, etc. Further, the portable computing device 100 may include an image capture device 118. In one embodiment the image capturing device 118 may be located on a transparent portion of the display trim 116. The image capture device 118 can be configured to capture both still and video images in some embodiments.

Figure 3:
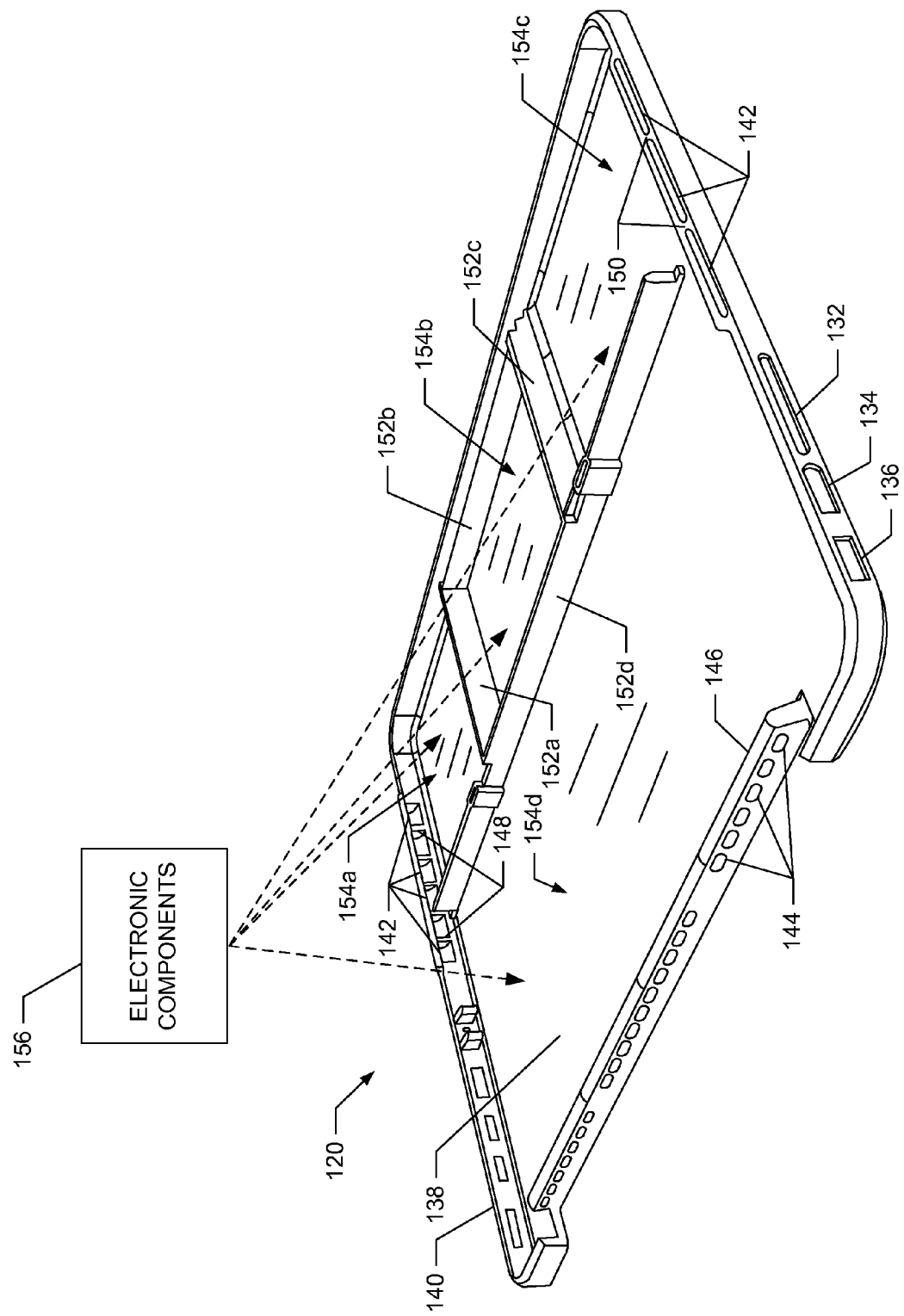
FIG. 3 illustrates a bottom perspective view of a top case of a base portion of the portable computing device of FIG. 1 according to an example embodiment of the present disclosure.
Figure 4:
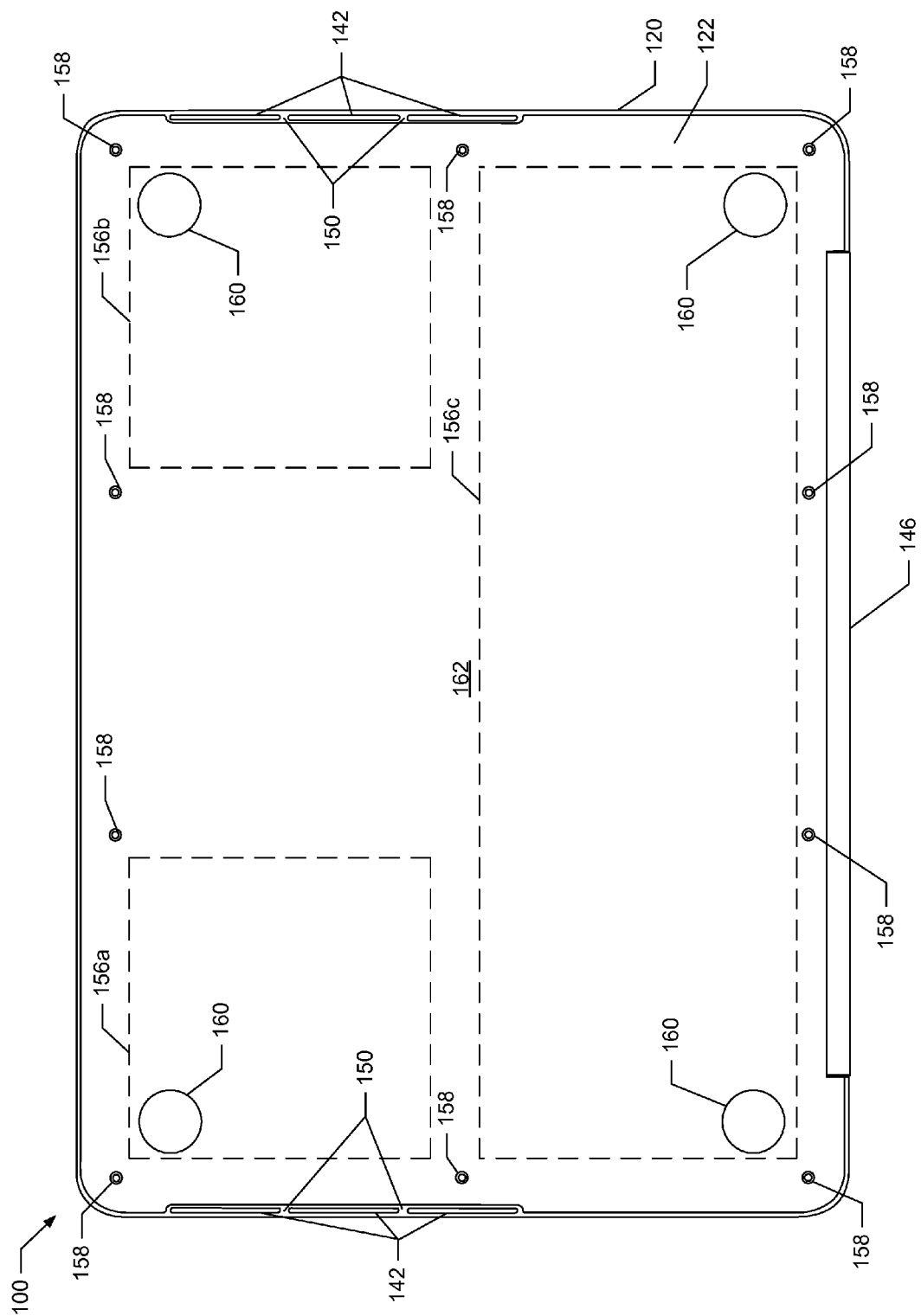
FIG. 4 shows a bottom view of the portable computing device of FIG. 1 according to an example embodiment of the present disclosure.

The base portion 104 may comprise a top case 120 (see, e.g., FIG. 3) fastened to a bottom case 122 (see, e.g., FIG. 4). As illustrated in FIG. 2, the top case 120 can be configured to accommodate various user input devices such as a keyboard 124 and a touchpad 126. The keyboard 124 can include a plurality of low profile keycap assemblies 128. In one embodiment, an audio transducer (not shown) can use selected portions of keyboard 124 to control output audio signals such as music. One or more microphones 130 can be located on the lid portion 106. The microphones 130 may be spaced apart to improve frequency response of an associated audio circuit.

Each of the plurality of keycap assemblies 128 can have a symbol imprinted thereon for identifying the key input associated with the particular key pad. The keyboard 124 can be arranged to receive a discrete input at each keycap assembly 128 using a finger motion referred to as a keystroke. In the described embodiment, the symbols on each keycap assembly 128 can be laser etched thereby creating an extremely clean and durable imprint that will not fade under the constant application of keystrokes over the life of portable computing device 100. In order to reduce component count, one of the keycap assemblies 128 can be re-provisioned as a power button. In this way, the overall number of components in the portable computing device 100 can be commensurably reduced.

The touchpad 126 can be configured to receive finger gesturing. A finger gesture can include touch events from more than one finger applied in unison. The gesture can also include a single finger touch event such as a swipe or a tap. The gesture can be sensed by a sensing circuit in the touchpad 126 and converted to electrical signals that are passed to a processing unit for evaluation. In this way, portable computing device 100 can be at least partially controlled by touch.

One or more data ports 132, 134, 136 can be used to transfer data and/or power between an external circuit(s) and the portable computing device 100. The data ports 132, 134, 136 can include, for example, an input slot 132 that can be used to accept a memory card (such as a FLASH memory card), whereas the remaining data ports 132, 134 can be used to accommodate data connections such as USB, FireWire, Thunderbolt, and so on. Further, in some embodiments, one or more speaker grids 137 can be used to output audio from an associated audio component enclosed within base portion 104 of the housing 102.

FIG. 3 illustrates a perspective bottom view of the top case 120 of the base portion 104 of the housing 102. As illustrated, the top case 120 may comprise a major wall 138 and an outer rim 140 extending therefrom. A plurality of vents 142 may be defined in the top case 120. For example, the vents 142 are defined in the outer rim 140 in the illustrated embodiment. The vents 142 may be configured to provide a flow of outside air that can be used to cool internal components by allowing air to enter or exit therethrough. For example, the vents 142 in the outer rim 140 may comprise intake vents and a plurality of vents 144 defined in a rear wall 146 may comprise exhaust vents. In another embodiment the vents 142 in the outer rim 140 can act as a secondary air intake subordinate to primary air intake vents or the vents in the outer rim may comprise exhaust vents.

The vents 142 in the outer rim 140 can also be used to output audio signals in the form of sound generated by an audio module. Accordingly, the vents 142 can be used to output sound at a selected frequency range in order to improve quality of an audio presentation by the portable computing device 100. Additionally, the vents 142 in the outer rim 140 can be part of an integrated support system for the top case 120. In this regard, internal ribs 148 may be positioned within the vents 142 and/or external ribs 150 may be positioned between the vents to provide additional structural support to the portable computing device 100. In some embodiments the vents 142 may be machined from the material defining the top case 120 with the ribs 148, 150 comprising retained material.

The cadence and size of the vents 142 can be used to control air flow into portable computing device 100 as well as control emission of radio frequency (RF) energy in the form of electromagnetic interference (EMI) from the portable computing device. In this regard, the internal ribs 148 can separate an area within the vents 142 to produce an aperture sized to reduce passage of RF energy. The size of an aperture defined by each of the vents 142 may dictate the wavelength of RF energy that can be "trapped" by the aperture. In this case, the size of vents 142 is such that a substantial portion of RF energy emitted by internal components can be trapped within the portable computing device 100. Furthermore, by placing vents 142 at a downward facing outer surface of the top case 120, the aesthetics of portable computing device 100 can be enhanced since views of internal components from an external observer are eliminated during normal use.

As illustrated, the rear wall 146 may extend from the major wall 138. The rear wall may be configured to hide the clutch at the hinge between the base portion 104 and the lid portion 106 of the housing 102. A plurality of inner sidewalls 152a-d may also extend from the major wall 138. The inner sidewalls 152a-d may divide an interior space defined by the base portion 104 into a plurality of compartments 154a-d.

As schematically illustrated in FIG. 3, the portable computing device 100 may include a plurality of electronic components 156, which may be received in one or more of the compartments 154a-d. As may be understood, by way of example, the electronic components 156 may include a mass storage device (e.g., a hard drive or a solid state storage device such as a flash memory device including non-transitory and tangible memory that may be, for example, volatile and/or non-volatile memory) configured to store information, data, files, applications, instructions or the like, a processor (e.g., a microprocessor or controller) configured to control the overall operation of the portable electronic device, a communication interface configured for transmitting and receiving data through, for example, a wired or wireless network such as a local area network (LAN), a metropolitan area network (MAN), and/or a wide area network (WAN), for example, the Internet, a fan, a heat pipe, and one or more batteries. However, various other electronic components may additionally or alternatively be received in the housing 102 of the portable electronic device as may be understood by one having skill in the art.

FIG. 4 shows an external view of the bottom of the bottom case 122 of the base portion 104 of the housing 102. One or more fasteners 158 may be positioned at the bottom case 122 of the base portion 104 of the housing 102. The fasteners 158 may be configured to secure the bottom case 122 to the top case 120 to enclose the above-described electronic components 156.

Additionally, in some embodiments the portable computing device 100 may include one or more bumpers. Bumpers may serve a variety of purposes. In this regard, in the illustrated embodiment the portable computing device 100 includes bumpers in the form of feet 160 coupled to an outer surface 162 of the bottom case 122 of the base portion 104 of the housing 102.

Figure 5:
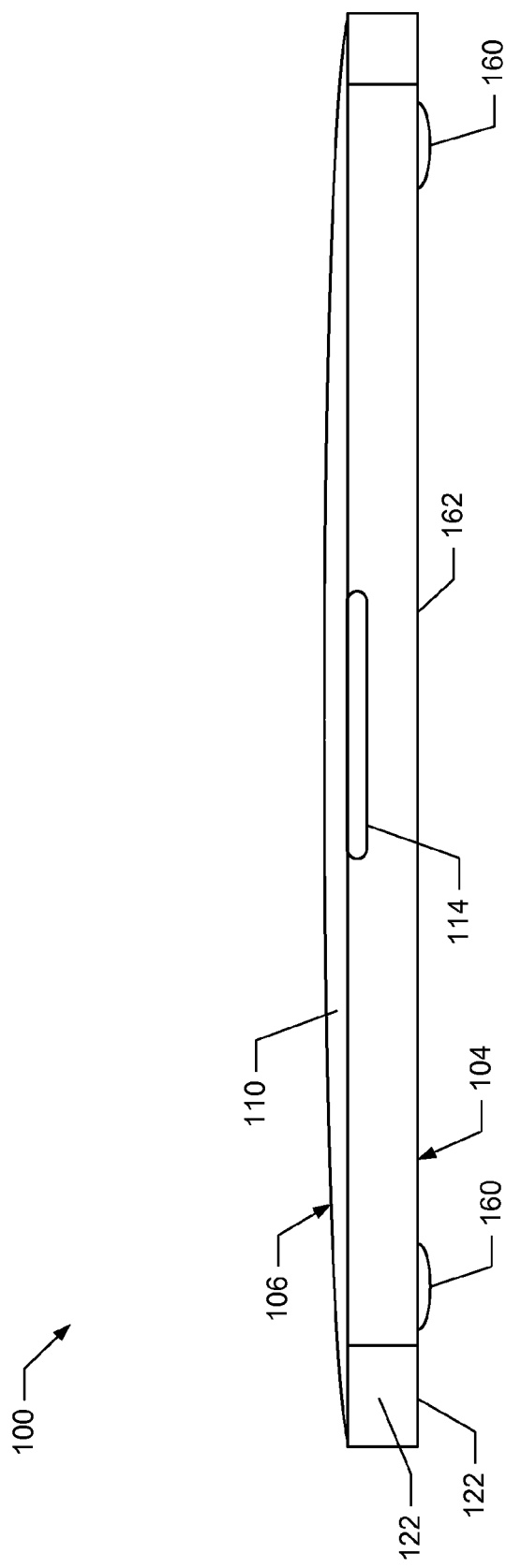
FIG. 5 illustrates a side view of the portable computing device of FIG. 1 in a closed configuration according to an example embodiment of the present disclosure.

As illustrated in FIG. 5, the feet 160 may be configured to elevate the housing 102 of the portable computing device 100 to improve cooling, provide a plurality of supports on which the portable computing device may balance with stability, resist slippage or movement of the portable computing device, provide a degree of shock absorption, prevent scratching or damage to a surface on which the portable computing device is positioned, and/or provide other benefits and functions. In this regard, in some embodiments the feet 160 may be formed from an elastomeric material such as rubber.

Figure 6:
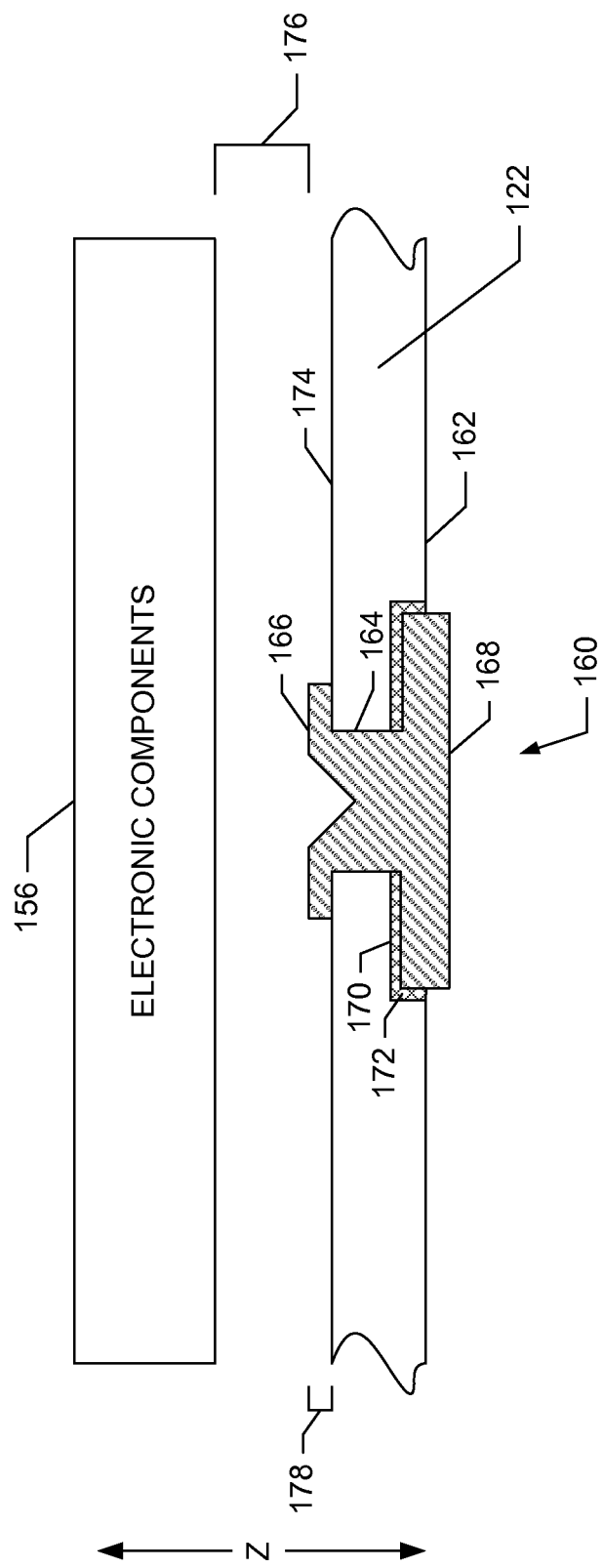
FIG. 6 illustrates a sectional view through a foot heat staked and pressure-adhered to the housing of the portable computing device of FIG. 1 according to an example embodiment of the present disclosure.

FIG. 6 illustrates a modified cross-sectional view through the portable computing device 100 at an embodiment of one of the feet 160. As illustrated, in one embodiment the foot 160 may extend through the bottom case 122 of the base portion 104 of the housing 102. In this regard, the bottom case 122 may comprise an aperture 164 configured to receive the foot 160 therein. More particularly, a first end 166 of the foot 160 may be inserted through the aperture 164 until a second end 168 of the foot contacts a ledge 170 surrounding the aperture.

As illustrated, a pressure sensitive adhesive 172 positioned at the ledge 170 may attach the second end 168 of the foot 160 to the outer surface 162 of the bottom case 122. Further, the first end 166 of the foot 160 may be heat staked proximate an inner surface 174 of the bottom case 122, whereby a heated pointed instrument is pressed against the first end of the foot to cause it to overlap with surrounding portions of the inner surface of the bottom case. Accordingly, the foot 160 may be retained by the overlapping relationship with the bottom case 122 at the inner and outer surfaces 162, 174 thereof. Additionally, the pressure sensitive adhesive 172 may resist movement of the foot 160 and seal the aperture 164.

However, the above-described embodiment of the foot 160 illustrated in FIG. 6 and variations thereof may suffer from certain disadvantages. In this regard, pressure sensitive adhesives may be subject to chemical degradation. In particular, fatty acids may degrade pressure sensitive adhesives. Such fatty acids may be present in hand lotions, body lotions, sunscreens, skin oils, and other substances that may be on a user's hands. Accordingly, such fatty acids may come into contact with, and breakdown, the pressure sensitive adhesives. Thereby, the seal at the aperture 164 may be compromised. Accordingly, the foot 160 may not no longer be securely attached to the bottom case 122. Further, liquid ingress through the aperture 164 may be possible, which could damage the electronic components 156 inside the housing 102.

Additionally, regardless of the ability of the pressure sensitive adhesive 172 to maintain a seal, the above-described foot 160 may suffer from additional disadvantages. In particular, extension of the feet 160 into the housing 102 of the portable electronic device 100 prevents placement of other components at these locations. In this regard, certain ones of the electronic components 156 may overlap with the feet 160 in a Z-height direction (see, FIG. 6). For example, FIG. 4 illustrates electronic components 156a, 156b, 156c positioned at locations that overlap with the electronic components. As illustrated in FIG. 6, in order to protect the electronic components 156 overlapping with the feet 160, a specified clearance 176 may be required between the feet and the electronic components, as illustrated in FIG. 6.

By way of example, one of the electronic components 156 overlapping with the feet 160 may comprise a battery. In order to prevent puncture of the battery, the clearance 176 must be maintained. This results in a lost Z-height loss of the battery equivalent to the Z-height extension 178 of the foot 160 into the housing 102 of the portable electronic device 100. This resulting loss in Z-height of the battery may cause the battery to have a reduced capacity substantially equivalent to the loss in volume thereof. Accordingly, impingement of the foot 160 into the housing 102 of the portable computing device 100 may cause the portable computing device to define a larger form or suffer from reduced performance.

Figure 7:
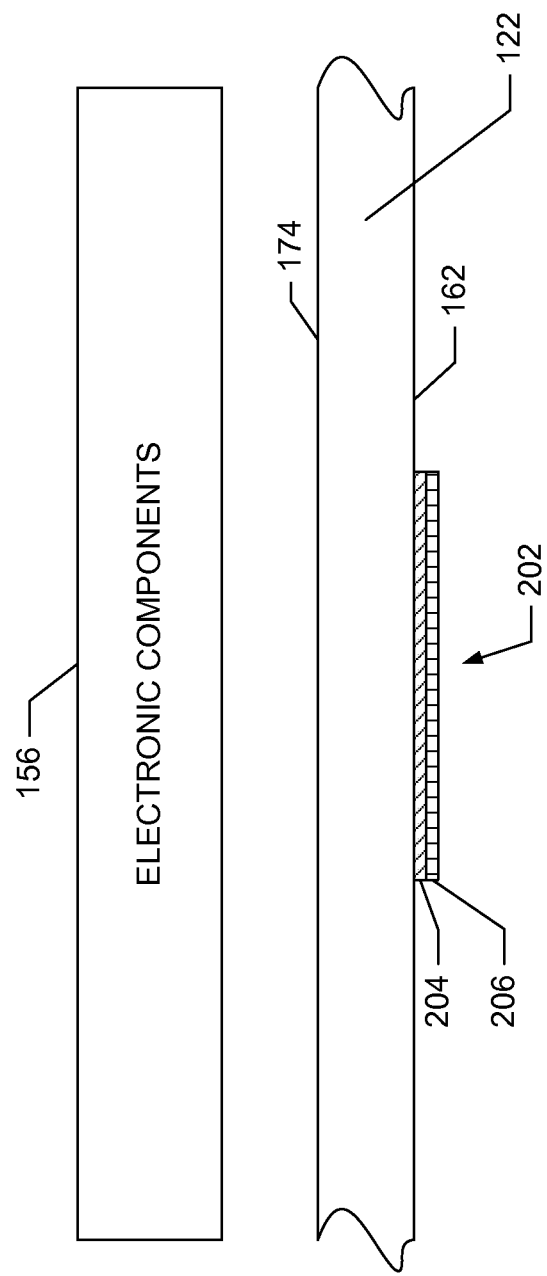
FIG. 7 illustrates a sectional view through a foot coupled to the housing of the portable computing device of FIG. 1 via a primer according to an example embodiment of the present disclosure.
Figure 8:
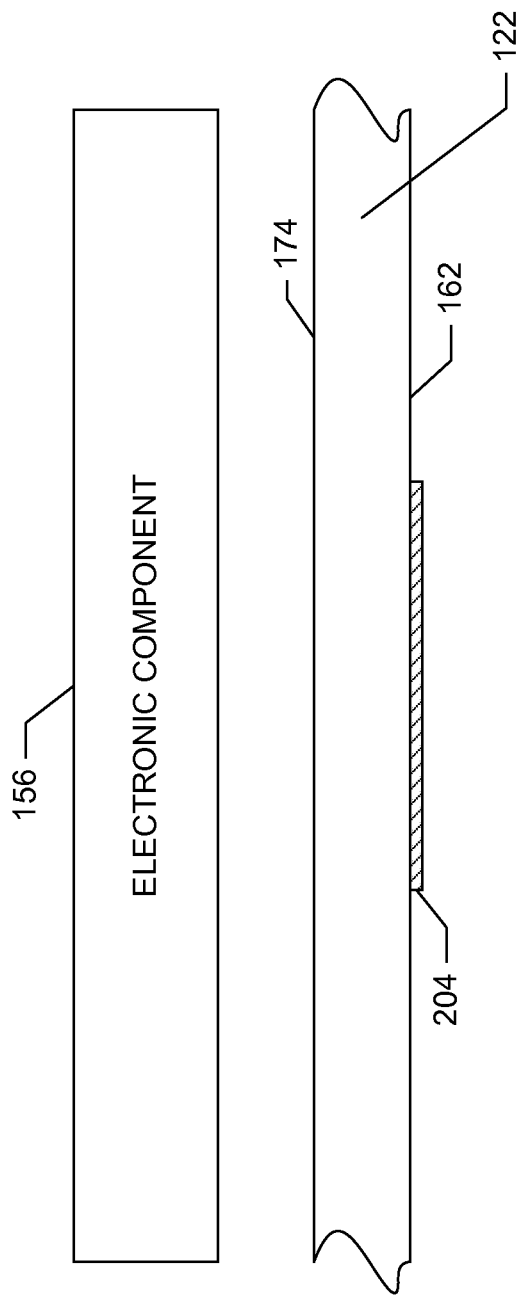
FIG. 8 illustrates a sectional view through primer locally applied to the portable computing device of 1 according to an example embodiment of the present disclosure.

Thus, embodiments of the present disclosure relate to bumpers configured to avoid the above-noted problems and provide other benefits as described herein. In this regard, FIG. 7 illustrates a sectional view through the portable computing device 100 at a bumper in the form of a foot 202 according to an embodiment of the present disclosure. The foot 202 may be employed with the portable computing device 100 described above or various other embodiments of computing devices and various other assemblies.

For example, as illustrated, the foot 202 may be coupled to the outer surface 162 of the bottom case 122 of the base portion 104 of the housing 102. More particularly, a primer 204 may be applied to the outer surface 162 of the bottom case 122 of the base portion 104 of the housing 102 and the foot 202 may be coupled to the housing via the primer. The primer 204 may be configured to provide a secure bond between the foot 202 and the outer surface 162 of the bottom case 122 of the base portion 104 of the housing 102.

In this regard, the primer 204 may be configured to chemically bond the foot 202 to the housing 102. The primer 204 may form a chemical bond with both the material defining the bottom case 122 of the base portion 104 of the housing 102 and the material defining the bumper 202. In some embodiments one or both of the bonds with the material defining the bottom case 122 and the material defining the bumper 202 may be covalent. A covalent bond is a chemical bond that involves the sharing of electron pairs between atoms. This produces a stable balance of attractive and repulsive forces between the atoms, thus resulting in a strong bond. The resulting bond may be an order of a magnitude stronger than bonds created by pressure sensitive adhesives, such as those employed in the embodiment of the foot 160 described above.

The foot 202 may comprise a layer 206 of a polymer, such as a cross-linked polymer that defines substantial strength. In one embodiment the material may comprise an elastomeric material such as a silicone composition. Use of an elastomeric material such as a silicone composition may provide benefits in terms of shock absorption, slippage resistance, and resistance to scratching other surfaces.

Further, in one embodiment the bottom case 122 of the base portion 104 of the housing 102 may comprise an aluminum alloy. Aluminum alloys are generally lightweight and strong, and hence use thereof may be desirable in the portable computing device 100. Further, aluminum alloys may be anodized or subjected to other finishing operations that may provide a pleasing cosmetic appearance.

As noted above, the primer 204 may be configured to provide a strong chemical bond between the selected materials defining the housing 102 and the foot 202. In this regard, the selected primer 204 may comprise a first functional group configured to bond to the housing 102 and a second functional group configured to bond to the foot 202. Thus, in the embodiment in which the housing 102 comprises an aluminum alloy and the foot comprises silicone, the primer 204 may comprise a silane composition. The silane composition may include silane, which is an inorganic compound with chemical formula $SiH_4$. The silane composition may include a first functional group with an affinity for aluminum oxide, as found in aluminum alloys, and a functional group with an affinity for silicone, as found in silicone compositions. Accordingly, a primer 204 comprising a silane composition may form a strong bond with both an aluminum alloy housing 102 and a silicone composition foot 202.

Accordingly, the foot 202 may be attached to the outer surface 162 of the bottom case 122 of the base portion 104 of the housing 102. Use of the primer 204 may eliminate the need for use of an aperture in the housing 102. Accordingly, as illustrated, the foot 202 may not extend into or through the housing 102 and the housing may be imperforate at the foot. Thus, issues with respect to liquid ingress at the foot 202 may be entirely avoided. Further, since the housing 102 does not include an aperture, the foot may be configured to be of any desired size. In this regard, the foot does not need to define a large surface area configured to surround an aperture to resist ingress of liquids therethrough. Additionally, since the foot 202 does not extend through the housing 102, relatively more usable space may be defined in within the housing. Further, issues with respect to the foot 202 damaging the electronic components 156 may be avoided because the housing 102 may be positioned between the electronic components and the foot. Thus, for example, a battery positioned in the housing 102 may not be punctured by the foot 202 since the housing is positioned therebetween.

Figure 9:
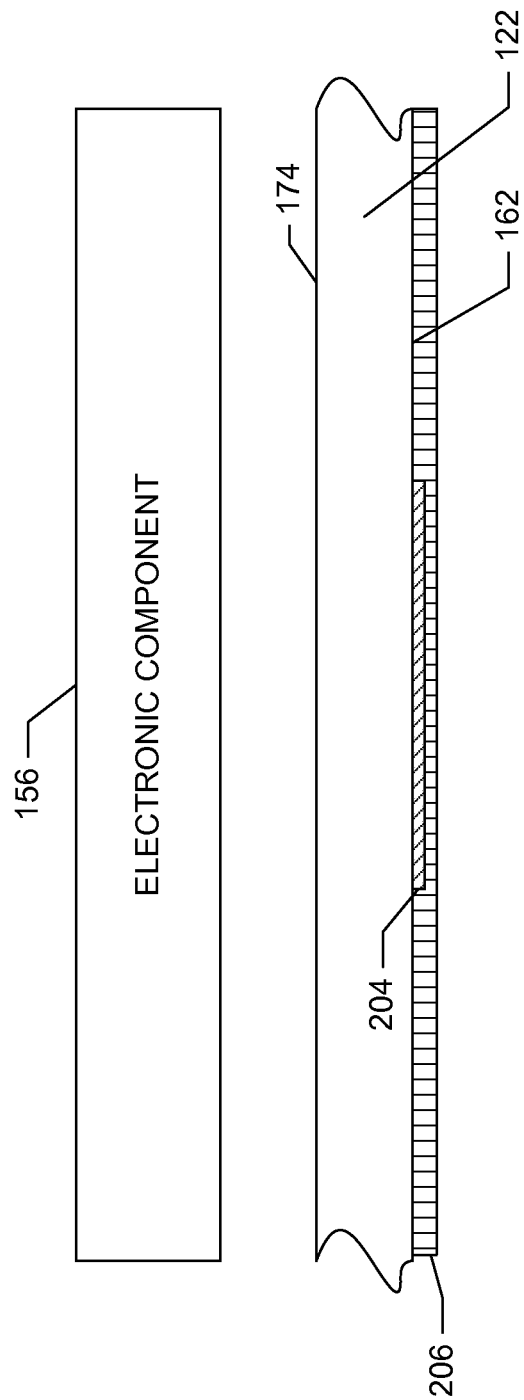
FIG. 9 illustrates a sectional view through polymer flood coating the locally applied primer of FIG. 8 according to an example embodiment of the present disclosure.
Figure 10:
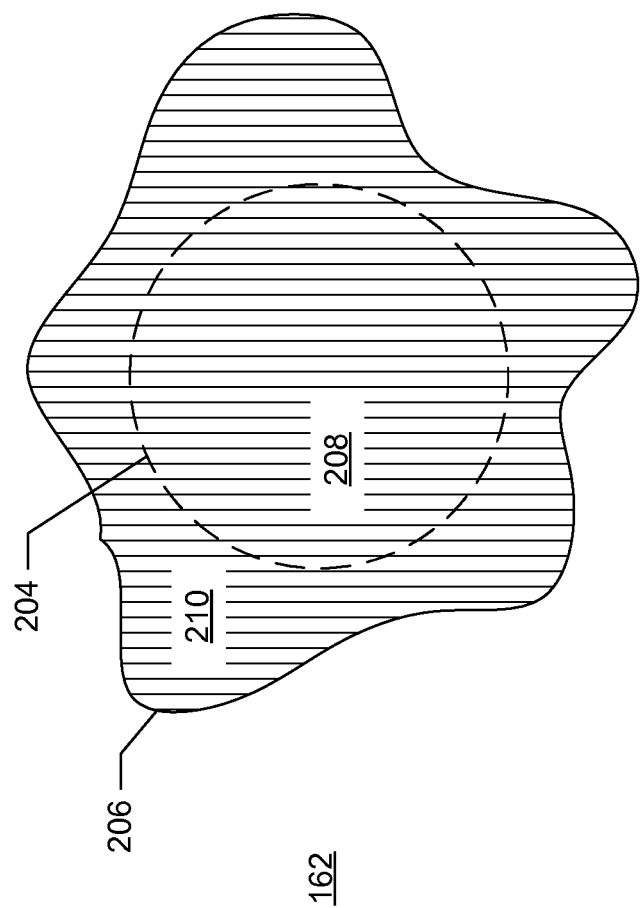
FIG. 10 illustrates a bottom view of polymer flood coated over the locally applied primer of FIG. 8 according to an example embodiment of the present disclosure.

The foot 202 may be formed in various manners. Generally, the foot 202 may be formed by applying the primer 204, followed by applying the layer 206 of polymer or other material defining the bumper 202 to the housing 102 at the primer. For example, FIG. 8. illustrates the primer 204 locally applied (e.g., inkjet, pad, screen, or otherwise printed) on a selected portion of the outer surface 162 of the bottom case 122 of the base portion 104 of the housing 102. Thereafter, the layer 206 of polymer (or other material defining the bumper 202) may be applied to the primer 204. For example, the layer 206 of polymer may be locally applied (e.g., inkjet, pad, screen, or otherwise printed) on the primer 204. Alternatively, as illustrated in FIG. 9, the layer 206 of the polymer or other material may be flood coated on at least a portion of the outer surface 162 of the housing 102 over the primer 204. FIG. 10 illustrates a bottom view of the outer surface 162 of the bottom case 122 after flood coating the layer 206 of polymer or other material thereon. In order to complete the foot 202, the layer 206 of polymer or other material may be cut (e.g., laser cut) at the perimeter of the area at which the primer 204 was locally applied. Thereby, a portion 208 of the layer 206 at the primer 204 may be retained, whereas a portion 210 of the layer 206 outside of the area defined by the primer 204 may be discarded. In this regard, the initial shape of the area defined by the locally applied primer 204 may define the resulting shape of the foot.

Figure 11:
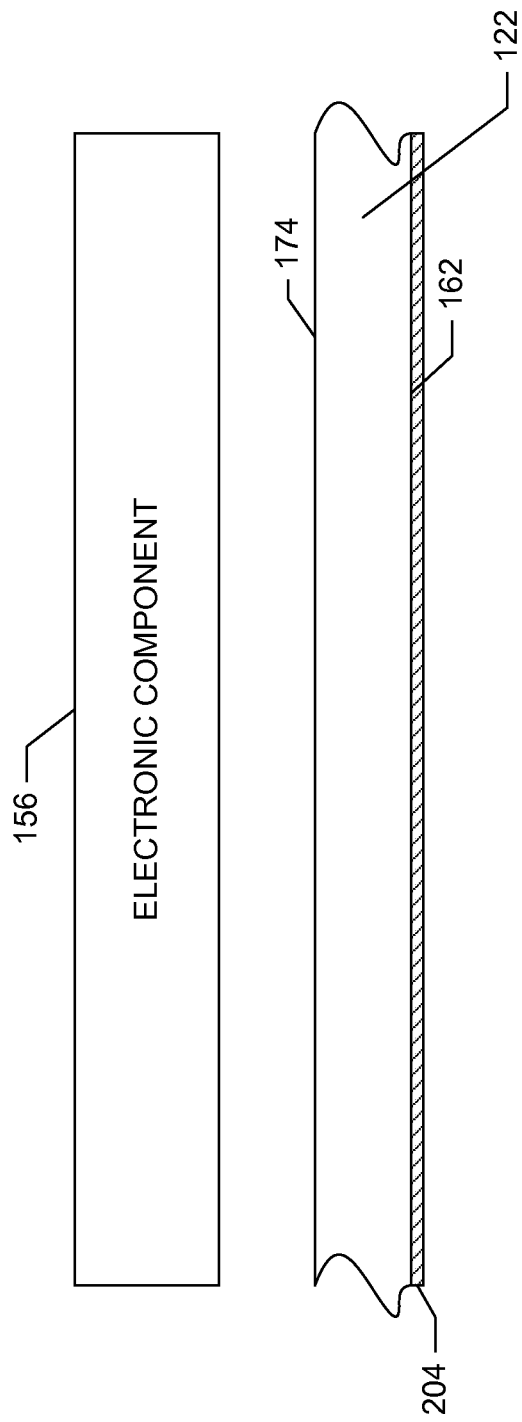
FIG. 11 illustrates a sectional view through primer flood coating the portable computing device of FIG. 1 according to an example embodiment of the present disclosure.
Figure 12:
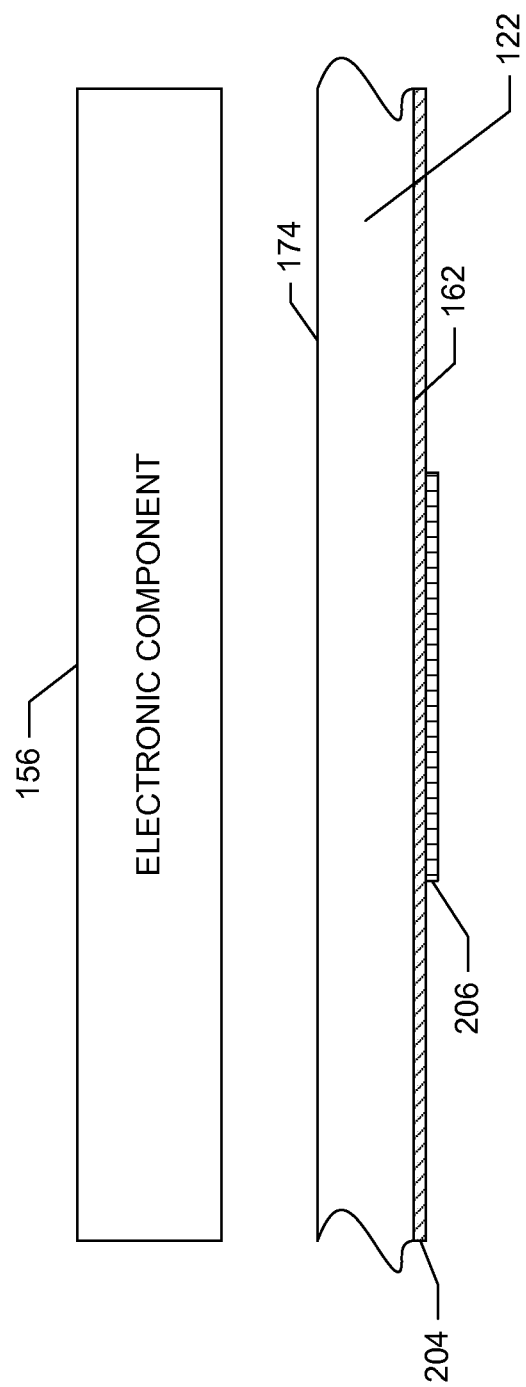
FIG. 12 illustrates a sectional view through polymer locally printed on the flood coated primer of FIG. 11 according to an example embodiment of the present disclosure.

In another embodiment, as illustrated in FIG. 11, the outer surface 162 of the bottom case 122 of the base portion 104 of the housing 102 may be flood coated with the primer 204 on at least a portion thereof. Thereafter, as illustrated in FIG. 12, the layer 206 of the polymer or other material defining the foot 202 may be locally applied (e.g., inkjet, pad, screen, or otherwise printed) over the primer 204 on a selected portion of the outer surface 162 of the bottom case 122 of the base portion 104 of the housing 102.

Figure 13:
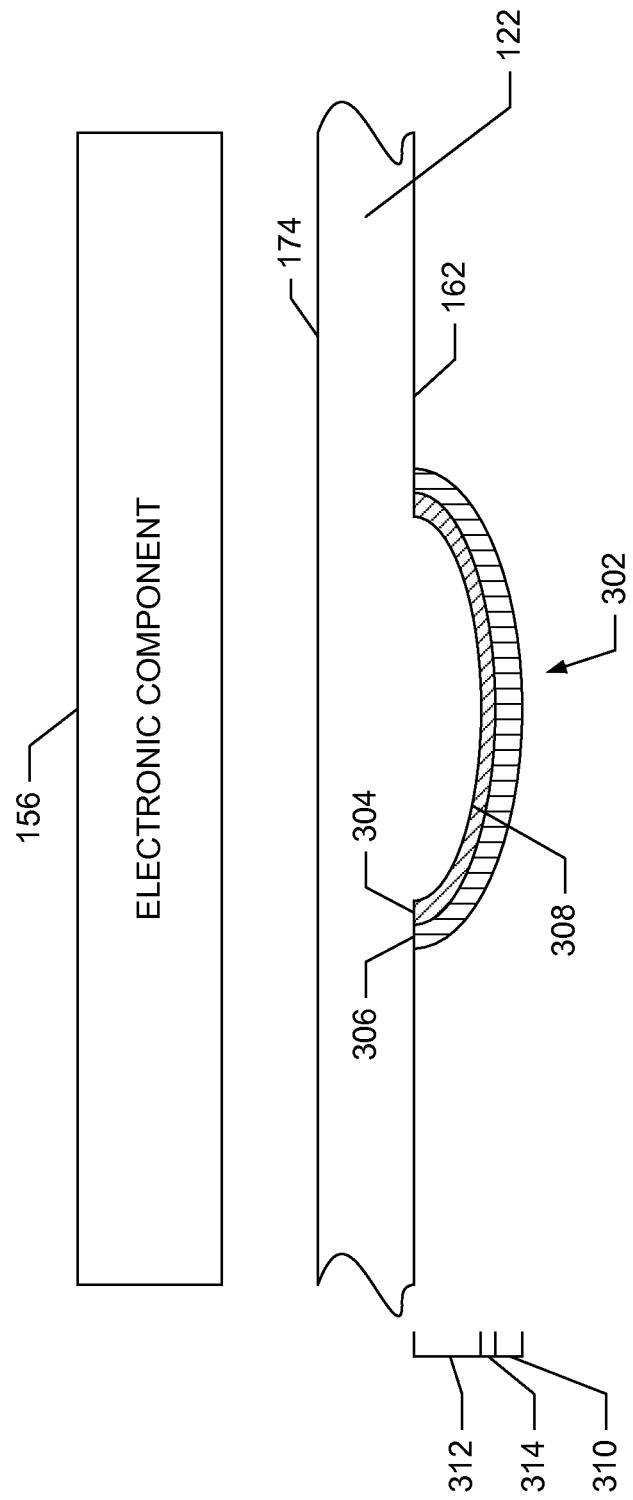
FIG. 13 illustrates a sectional view through a foot applied to a housing of the portable computing device of FIG. 1 via a primer at a protrusion according to an example embodiment of the present disclosure.

The foot may be formed on various other structures and surfaces. For example, FIG. 13 illustrates a foot 302 comprising a primer 304 and a layer 306 of material (e.g., a polymer) applied to a protrusion 308 extending outwardly from the bottom case 122 of the base portion 104 of the housing 102. In this regard, as illustrated, in some embodiments a thickness 310 of the foot 302 may be less than a thickness 312 of the protrusion 308 to which the foot 302 is attached. Further, the thickness 314 of the primer 304 may be less than the thickness 310 of the layer 306 of the material defining the foot 302 in some embodiments. Accordingly, the primary structure of the assembly may be defined by the protrusions 308, as opposed to the layer 306 of material defining the foot 302 or the primer 304 in some embodiments.

In one example embodiment the thickness 310 of the layer 306 of the material defining the foot 302 may be from about 0.1 micrometers to about 0.5 micrometers in some embodiments. Additionally, the thickness of one or both of the primer 304 and the layer 306 of material defining the foot 302 may be substantially uniform in some embodiments. Note that the description provided above relating to the thicknesses of the layers applies to all embodiments of the bumpers described herein, regardless of whether or not the housing to which the bumper is attached includes a protrusion.

Figure 14:
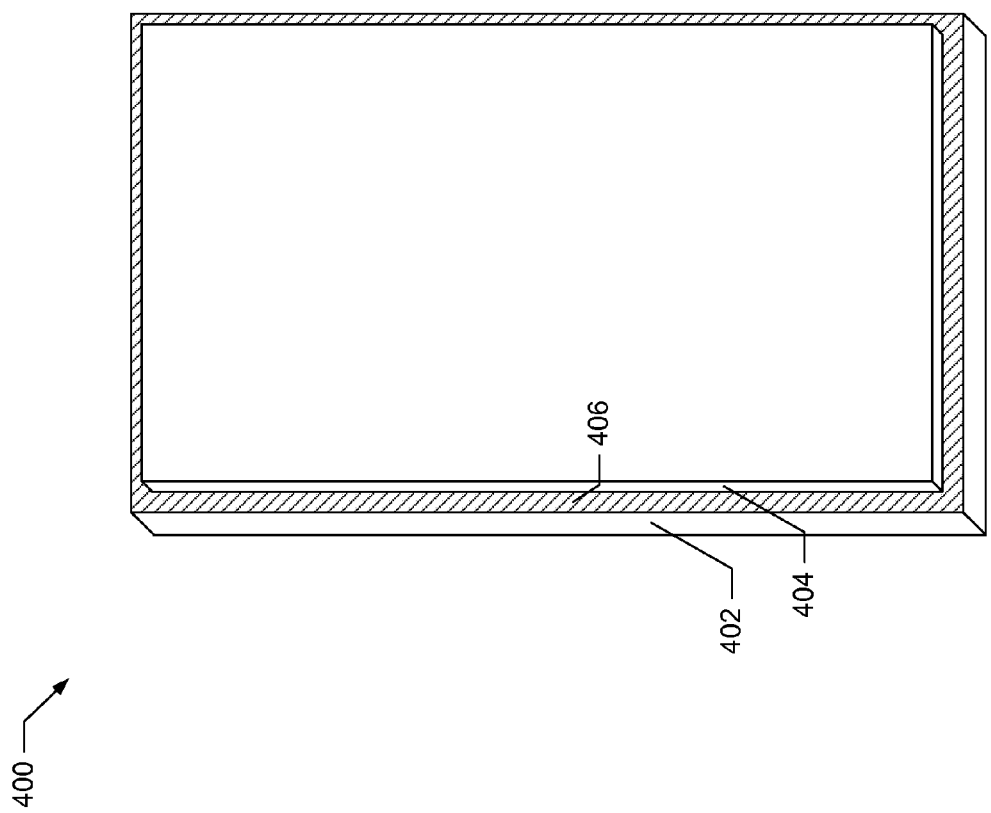
FIG. 14 illustrates a perspective view of a smartphone according to an example embodiment of the present disclosure.
Figure 15:
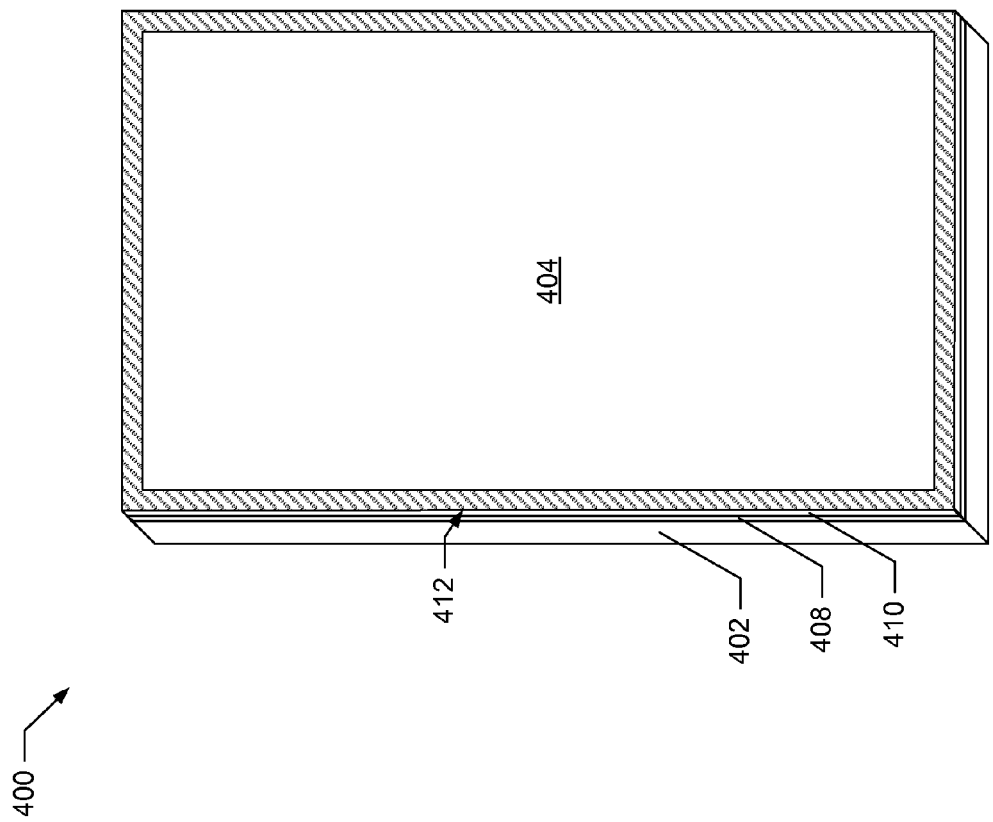
FIG. 15 illustrates a perspective view of a bumper coupled to the smartphone of FIG. 14 via a primer according to an example embodiment of the present disclosure.

The bumpers described herein may be employed for of various purposes other than feet on a bottom of a housing of a portable computing device. In this regard, for example, FIG. 14 illustrates a smartphone 14 including a housing 402 and a glass front 404, behind which a display may be mounted. As illustrated, a gap 406 may be defined around the perimeter of the housing 402 at the interface between the housing and the glass front 404. In order to protect the glass front 404 and/or provide a seamless interface therebetween, it may be desirable to position a bumper at the gap 406. In this regard, FIG. 15 illustrates a primer 408 applied at the gap 406 and a layer of material 410 (e.g., a polymer) applied thereon, which forms a bumper 412 extending around the perimeter of the housing 402 and the glass front 404.

As may be understood, various other structures may be formed using the methods and configurations described herein. For example, any embedded feature may be replaced by an externally-mounted feature, which may provide benefits in terms of no impingement within the housing of the device to which the bumper is attached. Further, bumpers may be added at any location to provide cushioning of internal components, protection of outer surfaces of the device, or perform other functions.

Figure 16:
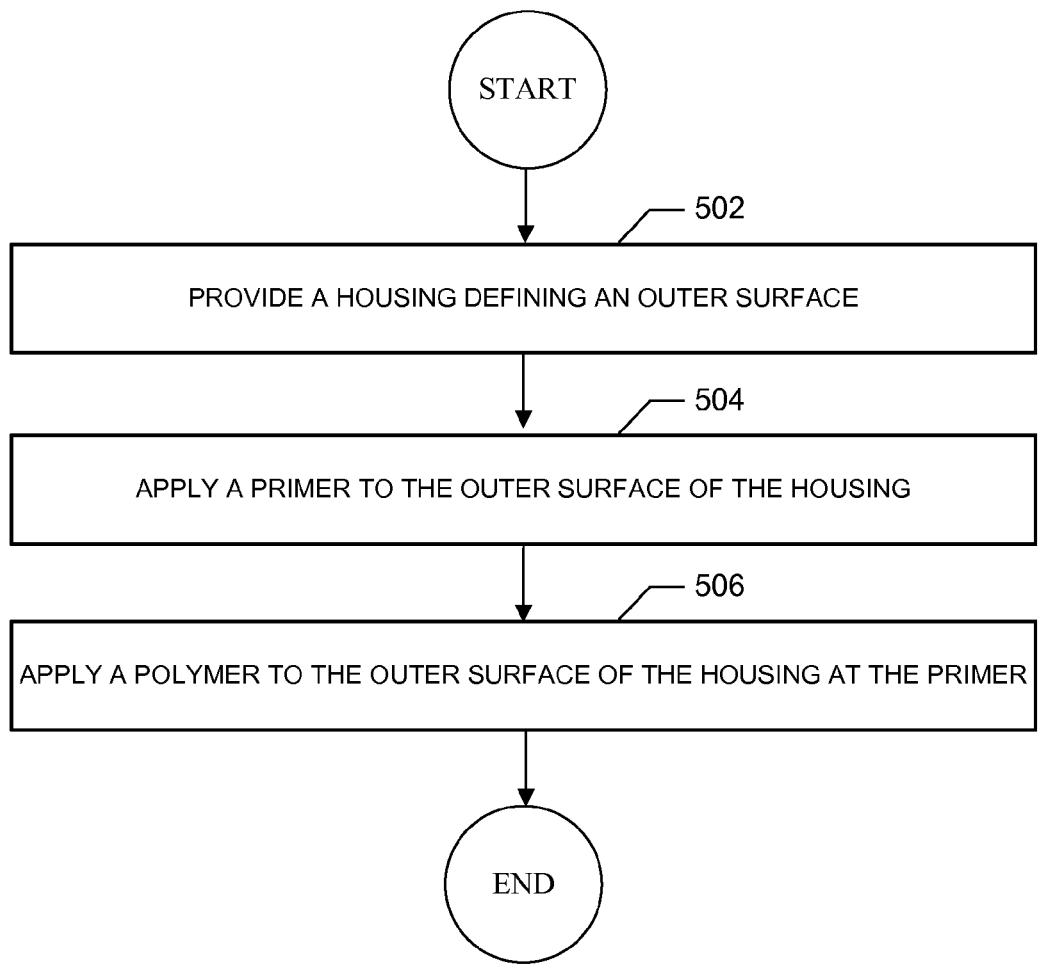
FIG. 16 schematically illustrates a method for forming a bumper according to an example embodiment of the present disclosure.

A related method for forming a bumper is also provided. As illustrated in FIG. 16, the method may include providing a housing defining an outer surface at operation 502. Further, the method may include applying a primer to the outer surface of the housing at operation 504. The method may additionally include applying a polymer to the outer surface of the housing at the primer at operation 506. In some embodiments the primer may comprise a first functional group configured to bond to the housing and a second functional group configured to bond to the polymer.

In one embodiment applying the primer to the outer surface of the housing at operation 504 may comprise flood coating the primer on at least a portion of the outer surface. Further, applying the polymer to the outer surface of the housing at operation 506 may comprise printing the polymer on the outer surface.

In another embodiment applying the primer to the outer surface of the housing at operation 504 may comprise printing the primer on the outer surface. Further applying the polymer to the outer surface of the housing at operation 506 may comprise flood coating the polymer on at least a portion of the outer surface. Additionally, the method may include cutting the polymer around the primer.

In some embodiments applying the polymer to the outer surface of the housing at the primer at operation 506 may comprise applying the polymer at a protrusion extending outwardly from the outer surface of the housing. Further, applying the polymer to the outer surface of the housing at the primer at operation 506 may comprise applying the polymer in a thickness that is substantially uniform. In one embodiment the thickness of the polymer may be from about 0.1 micrometers to about 0.5 micrometers.

Figure 17:
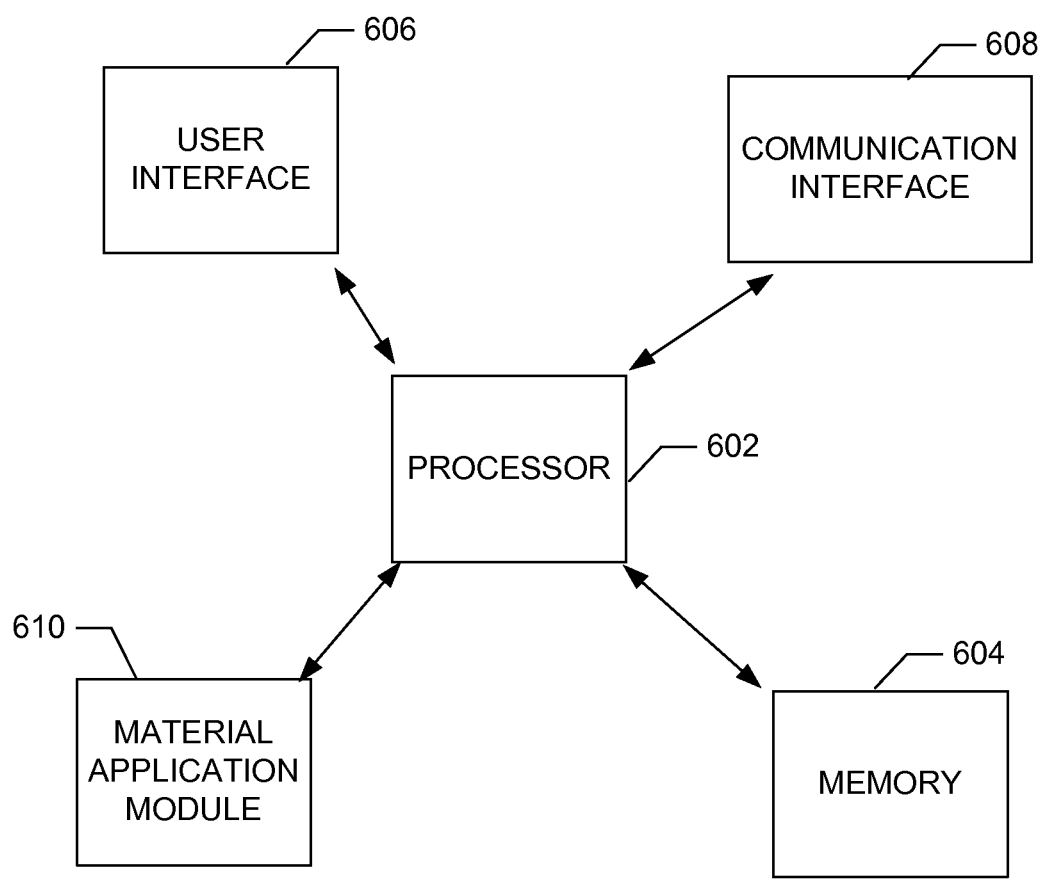
FIG. 17 schematically illustrates a block diagram of an electronic device according to an example embodiment of the present disclosure.

FIG. 17 is a block diagram of an electronic device 600 suitable for use with the described embodiments. In one example embodiment the electronic device 600 may be embodied in or as a controller configured for controlling operations performed in forming bumpers as described herein. In this regard, the electronic device 6—may be configured to control or execute the above-described primer and polymer material applications.

The electronic device 600 illustrates circuitry of a representative computing device. The electronic device 600 may include a processor 602 that may be microprocessor or controller for controlling the overall operation of the electronic device 600. In one embodiment the processor 602 may be particularly configured to perform the functions described herein relating to application of materials to a housing. The electronic device 600 may also include a memory device 604. The memory device 604 may include non-transitory and tangible memory that may be, for example, volatile and/or non-volatile memory. The memory device 604 may be configured to store information, data, files, applications, instructions or the like. For example, the memory device 604 could be configured to buffer input data for processing by the processor 602. Additionally or alternatively, the memory device 604 may be configured to store instructions for execution by the processor 602.

The electronic device 600 may also include a user interface 606 that allows a user of the electronic device 600 to interact with the electronic device. For example, the user interface 606 can take a variety of forms, such as a button, keypad, dial, touch screen, audio input interface, visual/image capture input interface, input in the form of sensor data, etc. Still further, the user interface 606 may be configured to output information to the user through a display, speaker, or other output device. A communication interface 608 may provide for transmitting and receiving data through, for example, a wired or wireless network such as a local area network (LAN), a metropolitan area network (MAN), and/or a wide area network (WAN), for example, the Internet.

The electronic device 600 may also include a material application module 610. The processor 602 may be embodied as, include or otherwise control the solid state deposition module 610. The material application module 610 may be configured for controlling or executing material application operations as discussed herein including, for example, application of primer to a housing and application of a polymer or other material at the primer.

Although the foregoing disclosure has been described in detail by way of illustration and example for purposes of clarity and understanding, it will be recognized that the above described disclosure may be embodied in numerous other specific variations and embodiments without departing from the spirit or essential characteristics of the disclosure. Certain changes and modifications may be practiced, and it is understood that the disclosure is not to be limited by the foregoing details, but rather is to be defined by the scope of the appended claims.

What is claimed is:

1. An assembly, comprising:
    a housing defining an outer surface and a protrusion extending outwardly from the outer surface;
    a primer applied to the outer surface of the housing at least at the protrusion; and
    a bumper coupled to the outer surface of the housing at least at the protrusion via the primer, the primer comprising a first functional group configured to bond to the housing and a second functional group configured to bond to the bumper.

2. The assembly of claim 1, wherein the primer comprises a silane composition.

3. The assembly of claim 2, wherein the bumper comprises a silicone composition and the housing comprises an aluminum alloy.

4. The assembly of claim 1, wherein the bumper does not extend through the housing.

5. The assembly of claim 4, wherein the housing is imperforate at the protrusion.

6. The assembly of claim 1, wherein the bumper defines a thickness that is substantially uniform.

7. The assembly of claim 6, wherein the thickness is from about 0.1 micrometers to about 0.5 micrometers.

8. The assembly of claim 1, wherein a thickness of the bumper is less than a thickness of the protrusion.

9. A computing device, comprising:
    a housing defining an outer surface and a protrusion integrally formed with and extending outwardly from the outer surface;
    a plurality of electronic components received in the housing;
    a primer applied to the outer surface of the housing; and
    a bumper coupled to the outer surface of the housing via the primer, the primer comprising a first functional group configured to bond to the housing and a second functional group configured to bond to the bumper.

10. The computing device of claim 9, further comprising a battery received in the housing, wherein the housing is positioned between the battery and the bumper.

11. The computing device of claim 10, wherein the bumper does not extend through the housing.

12. The computing device of claim 11, wherein the housing is imperforate at the bumper.

13. The computing device of claim 9, wherein the bumper comprises a foot positioned at a bottom of the housing.

14. The computing device of claim 9, wherein the bumper extends around the perimeter of the housing.

15. The computing device of claim 9, wherein, the bumper is positioned at the protrusion.

16. A method for forming a bumper, comprising:
    providing a housing defining an outer surface and a protrusion extending outwardly from the outer surface;
    applying a primer to the outer surface of the housing;
    applying a polymer to the outer surface of the housing at the primer, the primer comprising a first functional group configured to bond to the housing and a second functional group configured to bond to the polymer, wherein applying the polymer to the outer surface of the housing at the primer comprises applying the polymer in a thickness that is substantially uniform, wherein the thickness is from about 0.1 micrometers to about 0.5 micrometers.

17. The method of claim 16, wherein applying the primer to the outer surface of the housing comprises flood coating the primer on at least a portion of the outer surface, and
    wherein applying the polymer to the outer surface of the housing comprises printing the polymer on the outer surface.

18. The method of claim 16, wherein applying the primer to the outer surface of the housing comprises printing the primer on the outer surface, and
    wherein applying the polymer to the outer surface of the housing comprises flood coating the polymer on at least a portion of the outer surface.

19. The method of claim 18, further comprising cutting the polymer around the primer.

20. The method of claim 16, wherein applying the polymer to the outer surface of the housing at the primer comprises applying the polymer at the protrusion.

* * * * *